United States Patent
Chiang et al.

(10) Patent No.: US 9,472,669 B1
(45) Date of Patent: Oct. 18, 2016

(54) SEMICONDUCTOR FIN FET DEVICE WITH EPITAXIAL SOURCE/DRAIN

(71) Applicant: TAIWAN SEMICONDUCTOR MANUFACTURING CO., LTD., Hsinchu (TW)

(72) Inventors: Hung-Li Chiang, Taipei (TW); Cheng-Yi Peng, Taipei (TW); Jyh-Cherng Sheu, HsinChu (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/846,414

(22) Filed: Sep. 4, 2015

(51) Int. Cl.
*H01L 21/336* (2006.01)
*H01L 29/78* (2006.01)
*H01L 27/088* (2006.01)
*H01L 21/8234* (2006.01)
*H01L 29/66* (2006.01)

(52) U.S. Cl.
CPC ... *H01L 29/7848* (2013.01); *H01L 21/823418* (2013.01); *H01L 21/823431* (2013.01); *H01L 21/823481* (2013.01); *H01L 27/0886* (2013.01); *H01L 29/66545* (2013.01); *H01L 29/66803* (2013.01); *H01L 2029/7858* (2013.01)

(58) Field of Classification Search
CPC ............. H01L 29/785; H01L 29/1054; H01L 29/7848
USPC .......................................... 438/284; 257/401
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2010/0248454 A1* | 9/2010 | Maszara | H01L 29/66795 438/478 |
| 2014/0239354 A1* | 8/2014 | Huang | H01L 29/66545 257/288 |
| 2014/0282326 A1 | 9/2014 | Chen et al. | |

FOREIGN PATENT DOCUMENTS

TW 201427018 A 7/2014
WO 2015/094309 A1 6/2015

OTHER PUBLICATIONS

Office Action Taiwanese Patent Application 10520968440 dated Aug. 4, 2016.

* cited by examiner

*Primary Examiner* — Theresa T Doan
(74) *Attorney, Agent, or Firm* — McDermott Will & Emery LLP

(57) ABSTRACT

In a method of fabricating a Fin FET, first and second fin structures are formed. The first and second fin structures protrude from an isolation insulating layer. A gate structure is formed over the first and second fin structures, each of which has source/drain regions, having a first width, outside of the gate structure. Portions of sidewalls of the source/drain regions are removed to form trimmed source/drain regions, each of which has a second width smaller than the first width. A strain material is formed over the trimmed source/drain regions such that the strain material formed on the first fin structure is separated from that on the second fin structure. An interlayer dielectric layer is formed over the gate structure and the source/drain regions with the strain material. A contact layer is formed on the strain material such that the contact layer wraps around the strain material.

20 Claims, 11 Drawing Sheets

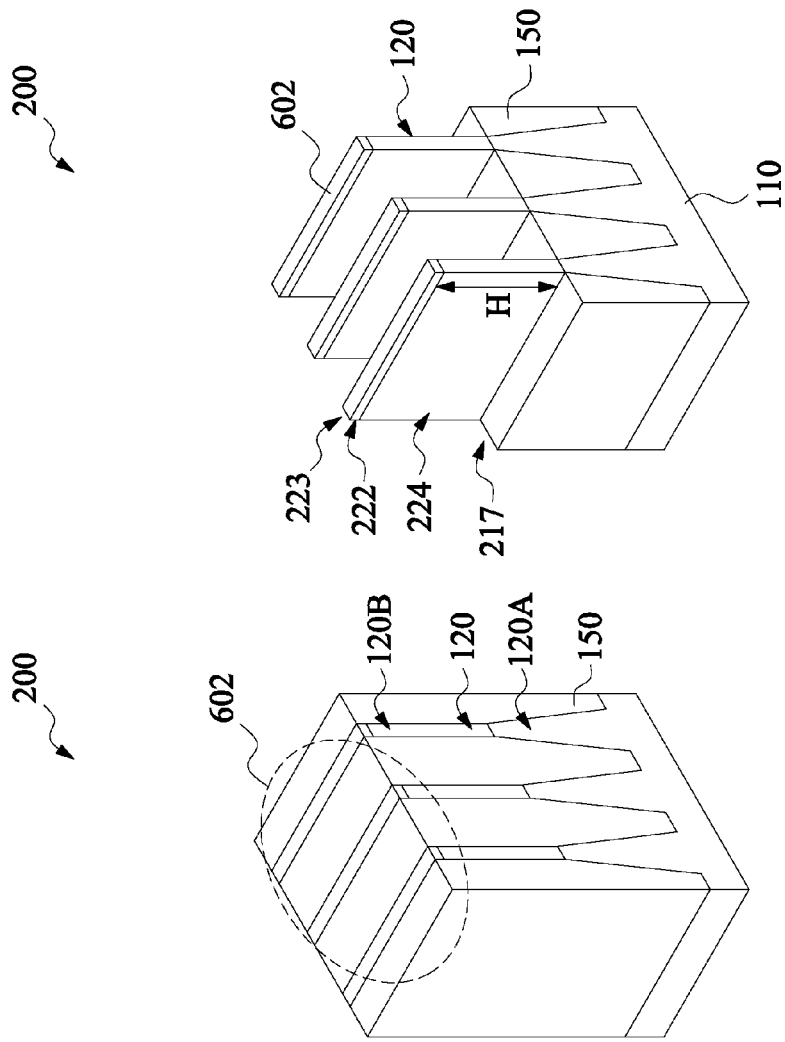
Fig. 7
Fig. 6
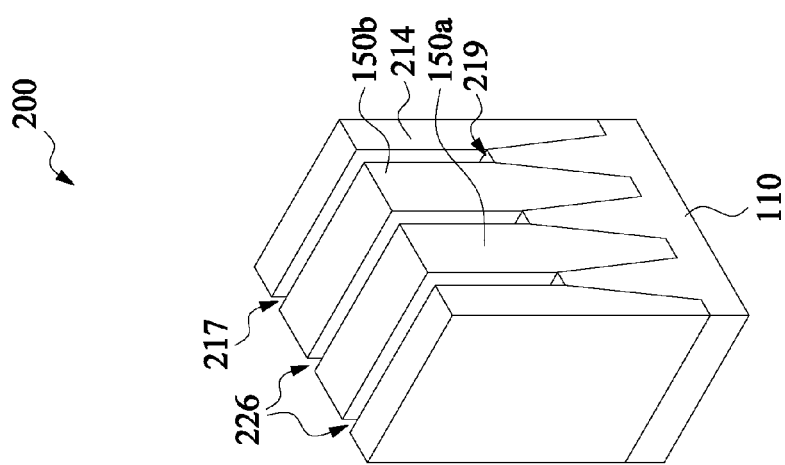
Fig. 5

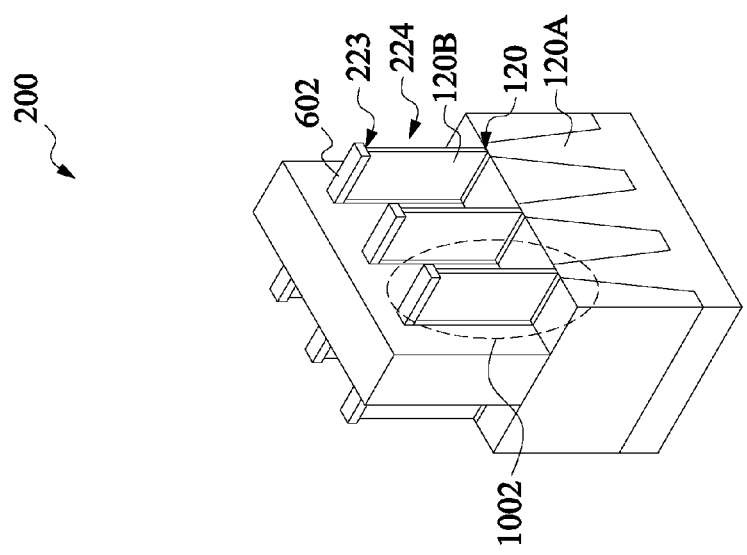
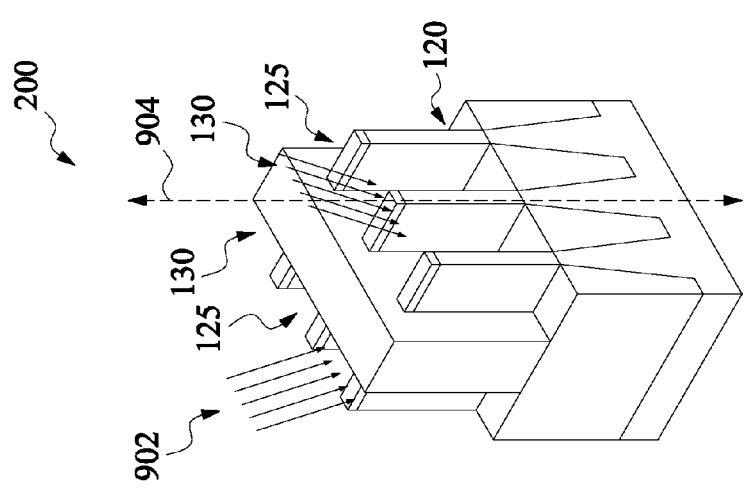
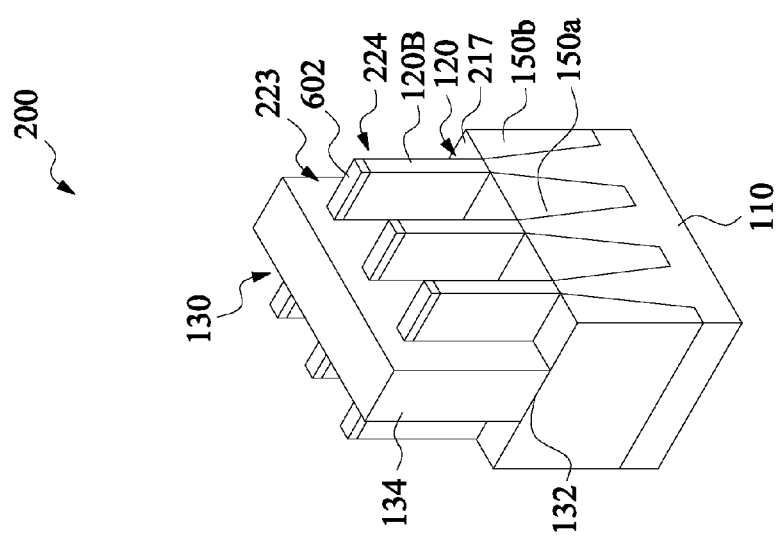

SEMICONDUCTOR FIN FET DEVICE WITH EPITAXIAL SOURCE/DRAIN

TECHNICAL FIELD

The disclosure relates to a semiconductor integrated circuit, more particularly to a semiconductor device having conformal epitaxial source/drain regions and wrap-around contacts and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices are a type of multi-gate structure that typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. Formation of contact areas in the source/drain regions are increasingly limited by the increasing device densities of the Fin FET devices.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

FIGS. 2-19 illustrate examples of perspective views of intermediate stages of a first sequential fabrication process of a Fin FET structure in accordance with one embodiment of the present disclosure.

DETAILED DESCRIPTION

Figure 1A:
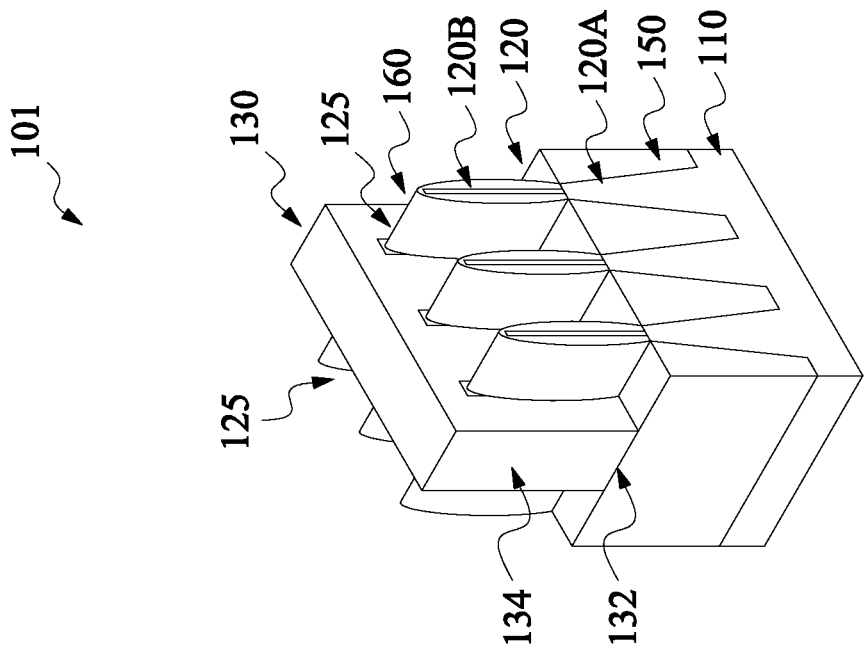
FIG. 1A is an exemplary perspective view of a Fin Field-Effect Transistor (Fin FET) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1B:
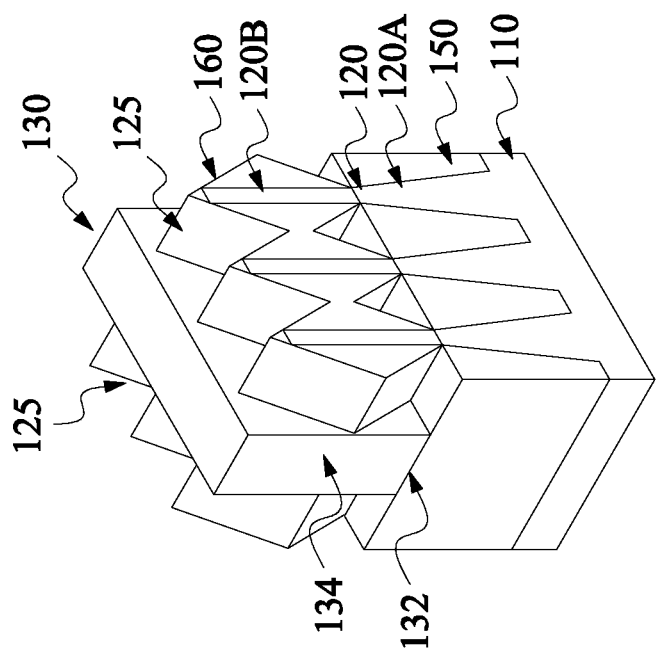
FIG. 1B is an exemplary perspective view of a Fin FET device in accordance with one embodiment of the present disclosure.

FIG. 1A is an exemplary perspective view of a Fin FET device 100 having a fin structure, and FIG. 1B is an exemplary perspective view of a Fin FET device 101 in accordance with one embodiment of the present disclosure. In these figures, some layers/features are omitted for simplification. The present disclosure includes examples relating to Fin FET devices for purposes of explaining features of the provided subject matter but the present disclosure may relate to other multi-gate structures depending on implementation.

The Fin FET device 100 and Fin FET device 101 respectively depicted in FIGS. 1A and 1B include, among other features, a substrate 110, a fin structure 120, a gate dielectric layer 132 and a gate electrode layer 134. The substrate 110 may be a silicon substrate.

In FIGS. 1A and 1B, the fin structure 120 is disposed over the substrate 110. The fin structure 120 may be made of the same material as the substrate 110 and may continuously extend from the substrate 110. In this embodiment, the fin structure is made of silicon (Si). The silicon layer of the fin structure 120 may be intrinsic, or appropriately doped with an n-type impurity or a p-type impurity.

Three fin structures 120 are disposed over the substrate 110 in FIGS. 1A and 1B. However, the number of the fin structures is not limited to three. The numbers may be one, two or four or more. In addition, one or more dummy fin structures may be disposed adjacent to both sides of the fin structures 120 to improve pattern fidelity in patterning operations. The width of the fin structure 120 is in a range of about 5 nm to about 40 nm in some embodiments, and may be in a range of about 7 nm to about 12 nm in certain embodiments. The height of the fin structure 120 is in a range of about 100 nm to about 300 nm in some embodiments, and may be in a range of about 50 nm to 100 nm in other embodiments.

Spaces between the fin structures 120 and/or a space between one fin structure and another element formed over the substrate 110 are filled by an isolation insulating layer 150 (or so-called a "shallow-trench-isolation (STI)" layer) including an insulating material. The insulating material for the isolation insulating layer 150 may include one or more layers of silicon oxide, silicon nitride, silicon oxynitride (SiON), SiOCN, fluorine-doped silicate glass (FSG), or a low-K dielectric material.

The lower part of the fin structure 120 under the gate electrode layer 134 is referred to as a well region 120A, and the upper part of the fin structure 120 is referred to as a channel region 120B. Under the gate electrode layer 134, the well region 120A is embedded in the isolation insulating layer 150, and the channel region 120B protrudes from the isolation insulating layer 150. A lower part of the channel region 120B may also be embedded in the isolation insulating layer 150 to a depth of about 1 nm to about 5 nm.

The channel region 120B protruding from the isolation insulating layer 150 is covered by a gate dielectric layer 132, and the gate dielectric layer 132 is further covered by a gate electrode layer 134. Part of the channel region 120B not covered by the gate electrode layer 134 functions as a source and/or drain of the Fin FET device 100.

In certain embodiments, the gate dielectric layer 132 includes one or more layers of a dielectric material, such as silicon oxide, silicon nitride, or high-k dielectric material, other suitable dielectric material, and/or combinations thereof. The gate electrode layer 134 includes one or more layers of any suitable conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable conductive materials, and/or combinations thereof.

Source and drain regions 125 are also formed in the upper part of the fin structure 120 not covered by the gate electrode layer 134, by appropriately doping impurities in the source and drain regions 125. An alloy of Si or Ge and a metal such as Co, Ni, W, Ti or Ta or any other suitable material may be formed on the source and drain regions 125.

Formation of the source/drain regions 125 are based on existing fabrication operations which include a deep source/drain recess operation, a selective epitaxial growth operation and a top-contact formation operation. The contact area depends on the surface area of the epitaxial source/drain region (e.g., the source/drain regions 125). The different growth rates of the different crystal orientations may result in a faceted or diamond-shaped source/drain structure.

In FIG. 1A, the source/drain regions 125 from adjacent fins are typically merged. As device densities increase, the fin pitch shrinkage causes a decrease in space between adjacent fins thereby increasing the likelihood of the source/drain regions 125 merging. Although the three source/drains (for three fin FETs) are designed to have the same electrical potential, in such a structure, a contact plug to the source/drain regions 125 from above may touch only the upper portions of the source/drain regions 125, and may not touch the side surface (in particular, bottom of the side surfaces) of the source/drain regions 125. This limits the formation of a "wrap-around" contact to the source/drain regions, and decreases the amount of contact area available, thereby increasing the parasitic resistance in the Fin FET device 100.

In contrast to the Fin FET device 100 shown in FIG. 1A, in FIG. 1B, the adjacent source/drain regions 125 are not merged with each other. Accordingly, the contact plug to the source/drain regions 125 from above can touch both the upper portions of the source/drain regions 125 and substantially the entire side walls of the source/drain regions 125, forming a "wrap-around" contact. In the structure of FIG. 1B, a greater contact area can be obtained, which can reduce parasitic capacitance.

The present disclosure provides for the formation of non-faceted fin-shaped, high aspect ratio (e.g., tall and thin) epitaxial source/drain regions that do not merge with that of an adjacent fin device (e.g., FIG. 1B). In this regard, wrap-around contact plugs may be formed for fins with an aggressively scaled fin pitch and a high aspect ratio. The combination of the wrap-around contact plug and the conformal epitaxial source/drain on fin-shaped source/drain can increase the amount of contact area and reduce the parasitic resistance in the Fin FET device. In addition, source/drain defects such as a void may be prevented due to the absence of merged source/drain regions. The advantageous features of the present disclosure include compatibility with existing FinFET-based CMOS device fabrication process flows with low additional cost compared with the original fabrication flow.

FIGS. 2-19 illustrate examples of cross sectional perspective views of intermediate stages in the sequential fabrication process of a Fin FET device 200 in accordance with some embodiments of the present disclosure. Not all of the depicted components may be required, however, and one or more implementations may include additional components not shown in the figure. Variations in the arrangement and type of the components may be made without departing from the scope of the claims as set forth herein. Additional components, different components, or fewer components may be provided. Further, the order of the operations may be changed.

Figure 2:
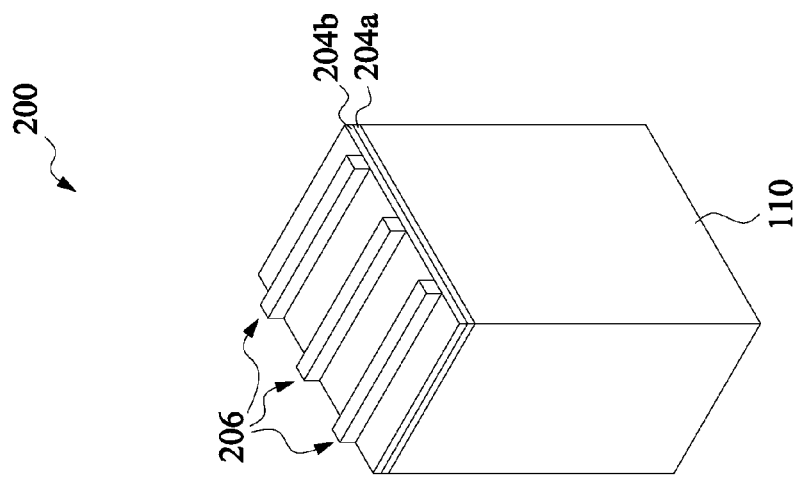

FIG. 2 is a perspective view of the Fin FET device 200 at an early stage of various stages of a first sequential fabrication process according to one embodiment of the present disclosure. In this embodiment, the substrate 110 includes a crystalline silicon substrate (e.g., wafer). A p-type substrate or n-type substrate may be used and the substrate 110 may include various doped regions, depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type Fin FET, or alternatively configured for a p-type Fin FET.

Alternatively, the substrate 110 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 110 is a silicon layer of an SOI (silicon-on insulator) substrate. When an SOI substrate is used, the fin structure 120 may protrude from the silicon layer of the SOI substrate or may protrude from the insulator layer of the SOI substrate. In the latter case, the silicon layer of the SOI substrate is used to form the fin structure 120. Amorphous substrates, such as amorphous Si or amorphous SiC, or insulating material, such as silicon oxide may also be used as the substrate 110.

Also alternatively, the substrate may include an epitaxial layer. For example, the substrate may have an epitaxial layer overlying a bulk semiconductor. Further, the substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Also alternatively, the substrate may include a buried dielectric layer, such as a buried oxide (BOX) layer, such as that formed by separation by implantation of oxygen (SI-MOX) technology, wafer bonding, SEG, or other appropriate operation.

As shown in FIG. 2, a pad layer 204a and a mask layer 204b are formed on the semiconductor substrate 110. The pad layer 204a may be a thin film having silicon oxide formed, for example, using a thermal oxidation operation. The pad layer 204a may act as an adhesion layer between the semiconductor substrate 110 and the mask layer 204b. In at least one embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent patterning operations. A photoresist layer 206 is formed over the mask layer 204b and is then patterned by a lithography patterning operation, thereby forming openings in the photoresist layer 206. The photoresist layer may be removed after patterning of the mask layer 204b and pad layer 204a and before the trench etching.

Figure 3:
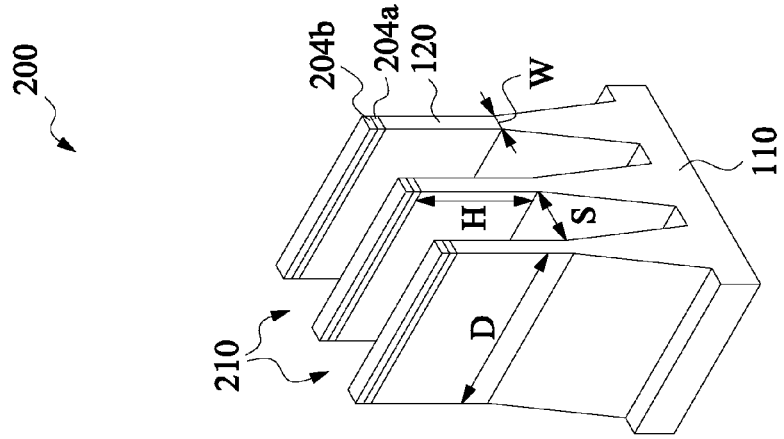

FIG. 3 is a perspective view of the Fin FET device 200 at one of various stages of a first sequential fabrication process according to an embodiment of the present disclosure. The mask layer 204b and pad layer 204a are etched to expose underlying semiconductor substrate 110. The exposed semiconductor substrate 110 is then trench-etched to form trenches 210 by using the patterned mask layer 204b and pad layer 204a as a mask.

In the trench etching operation, the substrate 110 may be etched by various methods, including a dry etch, a wet etch, or a combination of dry etch and wet etch. The dry etching operation may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, a wet cleaning operation may be performed to remove a native oxide of the semiconductor substrate 110 after the trench etching. The cleaning may be performed using dilute hydrofluoric (DHF) acid.

Portions of the semiconductor substrate 110 between trenches 210 form semiconductor fins 120. The fins 120 may be arranged in strips (viewed from the top of the Fin FET device 200) parallel to each other, and closely spaced with respect to each other. Each of the fins 120 has a width W and a depth D, and are spaced apart from an adjacent fin by a width S of the trench 210. For example, the width W of the semiconductor fin 120 may be in a range of about 2 nm to about 20 nm in some embodiments.

Figure 4:
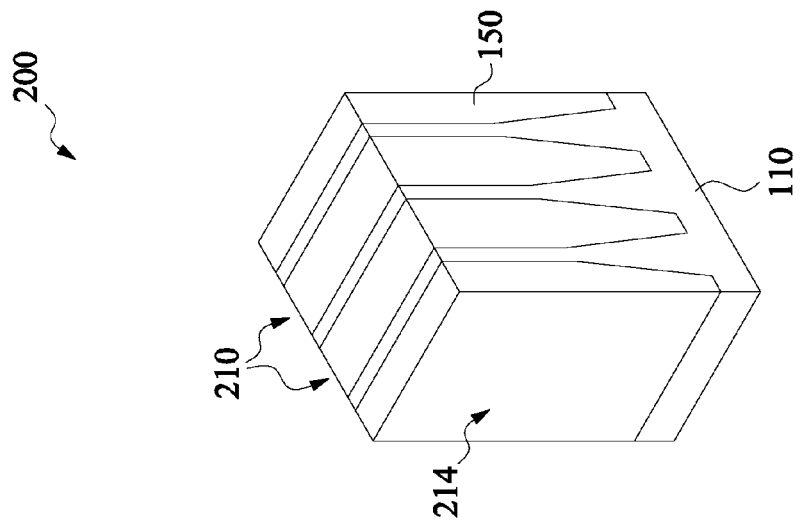

FIG. 4 is a perspective view of the Fin FET device 200 at one of various stages of a first sequential fabrication process according to an embodiment of the present disclosure. After trenches 210 and fins 120 are formed, trenches 210 are filled with one or more layers of dielectric material 214. The dielectric material 214 may include silicon oxide. In one or more implementations, the dielectric material 214 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted, and the flowable film is cured and annealed more than once.

In some embodiments, one or more layers of other dielectric materials, such as silicon nitride, silicon oxynitride, fluoride-doped silicate glass (FSG), or a low-K dielectric material, may also be used to form the dielectric material 214. In an embodiment, the dielectric material 214 is formed using a high-density-plasma (HDP) CVD operation, using silane ($SiH_4$) and oxygen ($O_2$) as reacting precursors. In other embodiments, the dielectric material 214 may be formed using a sub-atmospheric CVD (SACVD) operation or high aspect-ratio process (HARP), in which process gases may include tetraethylorthosilicate (TEOS) and/or ozone ($O_3$). In yet other embodiments, the dielectric material 214 may be formed using a spin-on-dielectric (SOD) operation, such as hydrogen silsesquioxane (HSQ) or methyl silsesquioxane (MSQ). In some embodiments, the filled recess region (or the trenches 210) may have a multi-layer structure such as a thermal oxide liner layer filled with silicon nitride or silicon oxide.

After the deposition of the dielectric material 214, a planarization operation such as a chemical mechanical polish (CMP) and an etch-back operation is then performed. In some embodiments, an annealing operation may be performed after the trenches 210 are filled with the dielectric material 214. The annealing operation includes rapid thermal annealing (RTA), laser annealing operations, or other suitable annealing operations.

During the planarization operation, the mask layer 204b and pad layer 204a may be removed. Alternatively, in at least one embodiment, if the mask layer 204b is formed of silicon nitride, the mask layer 204b may be removed using a wet operation using $H_3PO_4$. The pad layer 204a may be removed using dilute HF acid if the pad layer 204a is formed of silicon oxide. The remaining portions of the dielectric material 214 in the trenches 210 are hereinafter referred to as isolation regions 150.

FIG. 5 is a perspective view of the Fin FET device 200 at one of various stages of a first sequential fabrication process according to an embodiment of the present disclosure. The top portion of each of the semiconductor fin 120 is recessed to form a recessed portion 226 of the semiconductor fin 120 having a top surface 219 below the top surfaces 217 of the first and second isolation regions 150a, 150b. In one embodiment, a biased etching operation is performed to recess top surface 219 of the semiconductor fin 120 to form the recessed portion 226 of the semiconductor fin 120. In an embodiment, the etching operation may be performed using HBr and/or $Cl_2$ as etch gases.

FIG. 6 is a perspective view of the Fin FET device 200 at one of various stages of a first sequential fabrication process according to an embodiment of the present disclosure. As shown in FIG. 6, in the recessed portion 226, a semiconductor material for the channel region 120B (including the source and drain regions 125) and a hard mask layer 602 are formed in this order. The hard mask layer 602 is disposed on the channel region 120B. The hard mask layer 602 is used as a hard mask for patterning the semiconductor fins 120 in the source/drain region during subsequent etching operations. The hard mask layer 602 has a substantially slower etch rate compared to the channel region 120B. In some embodiments, the channel region 120B, such as silicon carbon (SiC) and/or silicon phosphide (SiP), is epitaxially grown by a LPCVD process over the recessed semiconductor fins 120. In at least another embodiment, the channel region 120B, such as silicon germanium (SiGe) or germanium tin (GeSn), may be epitaxially grown by the LPCVD process over the recessed semiconductor fins 120. The hard mask layer 602, such as Si, may be epitaxially grown by the LPCVD process. In some embodiments, the channel region 120B is made of Si and the hard mask layer 602 is made of SiC.

FIG. 7 is a perspective view of the Fin FET device 200 at one of various stages of a first sequential fabrication process according to an embodiment of the present disclosure. An etching operation is performed to etch part of isolation regions 150 to expose the channel region 120B of the semiconductor fins 120 from the isolation regions 150. In this embodiment, the hard mask layer 602 remains on the channel region 120B. The etching operation may include a dry etching operation, wet etching operation, or combination dry and wet etching operations to remove portions of the isolation regions 150. It is understood that the etching operation may be performed as one etching operation or multiple etching operations.

The remaining isolation regions 150 include top surfaces 217. Further, the channel regions 120B of the semiconductor fins 120 protruding over the top surfaces 217 of the remaining isolation regions 150 thus are used to form an active area of the Fin FET device 200. The channel region 120B of the semiconductor fins 120 may include top surfaces 223 and sidewalls 224. Height H of the channel region 120B of the semiconductor fins 120 from the top surface 217 of the isolation regions 150 may be in a range of about 6 nm to about 200 nm. In some embodiments, the height H is greater than 200 nm or smaller than 6 nm.

FIG. 8 is a perspective view of the Fin FET device 200 at one of various stages of a first sequential fabrication process according to an embodiment of the present disclosure.

After the channel region 120B is exposed from isolation regions 150, a gate stack 130 is formed over the exposed channel region 120B, so as to extend along the top surfaces 217 of the first isolation region 150a and the second isolation region 150b. In this embodiment, a section of the hard mask layer 602 is interposed between the semiconductor fin 120 (the exposed channel region 120B) and the gate stack 130. The gate stack 130 includes a gate dielectric layer 132 and a gate electrode layer 134 disposed on the gate dielectric layer 132.

The gate dielectric layer 132 is formed to cover the top surface 223 and sidewalls 224 of at least a portion of the channel region 120B of the semiconductor fins 120. In some embodiments, the gate dielectric layer 132 includes one or more layers of silicon oxide, silicon nitride, silicon oxynitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. Examples of high-k dielectric material include $HfO_2$, HfSiO, HfSiON, HMO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 132 may be formed using a suitable operation such as atomic layer deposition (ALD), chemical vapor deposition (CVD), physical vapor deposition (PVD), thermal oxidation, UV-ozone oxidation, or combinations thereof. The gate dielectric layer 132 may further include an interfacial layer (not shown) to reduce damage between the gate dielectric layer 132 and the semiconductor fin 120. The interfacial layer may include silicon oxide.

The gate electrode layer 134 is then formed on the gate dielectric layer 132. In at least one embodiment, the gate electrode layer 134 covers the channel region 120B of more than one semiconductor fin 120. In some alternative embodiments, each of the channel regions 120B of the semiconductor fins 120 may be used to form a separate Fin FET device 200. The gate electrode layer 134 may include a single layer or a multilayer structure. The gate electrode layer 134 may include poly-silicon. Further, the gate electrode layer 134 may be doped poly-silicon with the uniform or non-uniform doping. In some alternative embodiments, the gate electrode layer 134 may include a metal such as Al, Cu, W, Ti, Ta, TiN, TiAl, TiAlN, TaN, NiSi, CoSi, other conductive materials with a work function compatible with the substrate material, or combinations thereof. The gate electrode layer 134 may be formed using a suitable operation such as ALD, CVD, PVD, plating, or combinations thereof. In some embodiments, a hard mask layer, which has been used to pattern a poly silicon layer, is formed on the gate stack 130.

In some embodiments, one or more work function adjustment layers (not shown) may be interposed between the gate dielectric layer 132 and the gate electrode layer 134. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel region 120B. Similarly, for example, the second metal material for the p-channel Fin FET may include metals having a work function substantially aligned with a work function of the substrate valence band, or at least substantially aligned with a work function of the valence band of the channel region 120B. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer. In some embodiments, the work function adjustment layer may alternatively include a polysilicon layer. The work function adjustment layer may be formed by ALD, PVD, CVD, e-beam evaporation, or other suitable operation. Further, the work function adjustment layer may be formed separately for the n-channel Fin FET and the p-channel Fin FET, which may use different metal layers.

FIG. 9 is a perspective view of the Fin FET device 200 at one of various stages of a first sequential fabrication process according to an embodiment of the present disclosure. Following the formation of the gate stack 130, a lightlydoped-drain (LDD) implantation 902 is performed on the source/drain regions 125 of the semiconductor fins 120 not covered by the gate stack 130. The LDD implantation 902 may be performed with a tilt angle relative to vertical axis 904. In one or more implementations, the LDD implantation 902 may not be performed if the hard mask layer 602 is removed from the top surface 223 of the semiconductor fins 120 immediately after the patterning of the gate stack 130. The LDD implantation 902 may utilize p-type dopants (e.g., B or In) for PMOS devices and n-type dopants (P or As) for NMOS devices.

In some aspects, the LDD implantation 902 implants the dopant species using implant energy in a range of about 0.1 KeV to about 500 KeV. In some embodiments, the implant dosage may be in a range of about $1 \times 10^{12}$ atoms/cm$^2$ to about $1 \times 10^{15}$ atoms/cm$^2$. In other embodiments, the acceleration voltage is in a range of about 10 KeV to about 100 KeV. In one or more implementations, ions are also implanted into the sidewalls 224 of the exposed semiconductor fins 120. The tilt angle may vary in a range of about 0 degrees to about 45 degrees relative to the vertical axis 904. In addition, the ions can be implanted from two directions (e.g., 0 degrees and 180 degrees by rotating the wafer) or four directions.

Following the LDD implantation 902, a dielectric layer may be disposed along the side of the gate stack 130 to form sidewall spacers (not shown). In some embodiments, the dielectric layer includes one or more layers of silicon oxide, silicon nitride, silicon oxy-nitride, or other suitable material. The dielectric layer may include a single layer or multilayer structure. A blanket layer of the dielectric layer may be formed by CVD, PVD, ALD, or other suitable technique. Then, an anisotropic etching and/or etch-back operation is performed on the dielectric layer to form a pair of sidewall spacers on two sides of the gate stack 130. During the formation of the gate stack 130, various cleaning/etching operations, which etch the STI regions 150a and 150b, are performed. After the formation of the sidewall spacers, additional ion implantation operation may be performed to introduce impurities in the source and drain regions 125.

FIG. 10 is a perspective view of the Fin FET device 200 at one of various stages of a first sequential fabrication process according to an embodiment of the present disclosure. Following the LDD implantation 902, a lateral trimming of the sidewalls 224 of the semiconductor fins 120 by an etch operation 1002 is performed. The hard mask layer 602 serves to protect the top surface 223 of the semiconductor fins 120 by retaining the integrity of the sidewalls 224. In this regard, the hard mask layer 602 can reduce the etching rate at the top surface 223 thereby reducing the amount of etching at the top surface 223 for the same duration of etching on the remainder of the channel region 120B.

The portions of the sidewalls 224 located beneath the hard mask layer 602 can be removed (or etched) to reduce the size (width) of the source/drain region 125 (e.g., along the <110> axis) and thereby reduce the likelihood of the source/drain region 125 merging when a strain material is formed (e.g., adjacent strain materials becoming connected). In this embodiment, the etch operation 1002 is applied without a bias voltage (e.g., 0 V bias) but the bias voltage may vary for other implementations. The total amount of etching for the lateral trimming may be about 40% to about 60% of the original width of the channel region 120B. In other embodiments, the total amount of etching for the lateral trimming may be up to about 45% to about 50% of the original width of the channel region 120B. In this example, the minimum width of the source/drain regions 125 may be about 2.0 nm after the lateral trimming operation is performed. The etching rate and/or the duration of the etch operation 1002 may vary to yield the desired post-trimming width of the source/drain regions 125. In one or more implementations, the etching rates of the different crystal orientations (e.g., <100>, <110>, <101>) may vary relative to the respective epitaxy rates. In some embodiments, the etch operation 1002 is applied recursively in a closed loop until the desired post-trimming width is reached. For example, a number of iterations for removing material from the sidewalls 224 are performed to yield the desired width of the source/drain regions 125.

The etch operation may include a dry etching operation, wet etching operation, or combination dry and wet etching operations. It is understood that the etching operation may be performed as one etching operation or multiple etching operations. The etch operation also may include an anisotropic etching and/or etch-back operation performed on the sidewalls 224 to reduce the width of the source/drain regions 125.

In one or more implementations, a surface plasma treatment may be applied on the sidewalls 224 to increase the etching rate at the surface of the sidewalls 224. In other implementations, an atomic layer etch operation is applied to shape the sidewalls 224 to the desired width for subsequent source/drain epitaxial operations.

Figure 11:
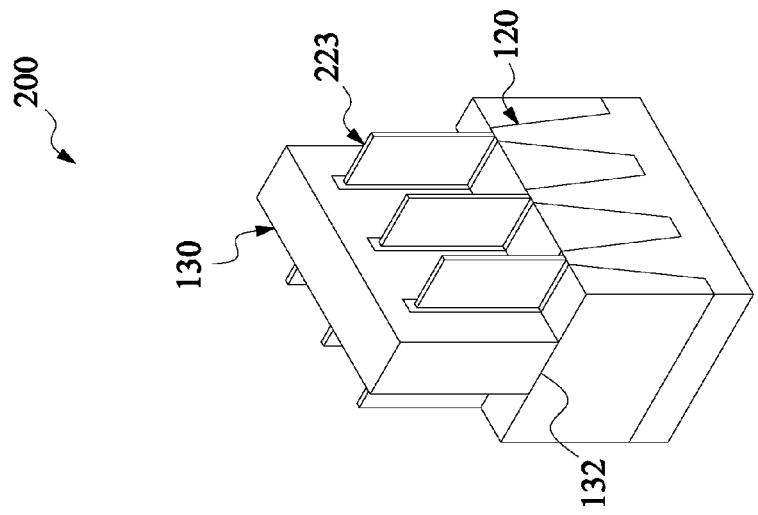

FIG. 11 is a perspective view of the Fin FET device 200 at one of various stages of a first sequential fabrication process according to an embodiment of the present disclosure. Following the trimming operation 1002, the hard mask layer 602 is removed from the top surface 223 of the semiconductor fins 120. The hard mask layer 602 may be removed using suitable etching and/or cleaning operations. In some embodiments, remnants of the hard mask layer 602 may be interposed between the gate dielectric layer 132 and the channel region 120B under the gate stack 130.

Figure 12:
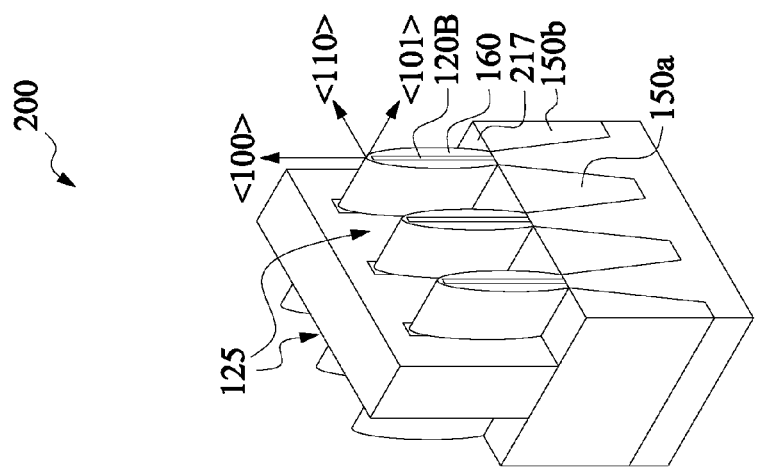

FIG. 12 is a perspective view of the Fin FET device 200 at one of various stages of a first sequential fabrication process according to an embodiment of the present disclosure. The structures depicted in FIG. 12 are produced by selectively growing a strained material 160 over the trimmed semiconductor fin 120 and extending over the top surfaces 217 of the first and second isolation regions 150a, 150b. Since the lattice constant of the strained material 160 is different from the channel region 120B, the channel region 120B is strained or stressed to increase carrier mobility and enhance the device performance. In this embodiment, the strained material 160 is formed separately (i.e., without merging) with respect to each semiconductor fin 120. The trimmed portions of the semiconductor fin 120 allow for an increase in the spaces between adjacent fin structures and reduce the likelihood of the strain material 160 of merging (e.g., adjacent strain material becoming merged).

In at least one embodiment, the strained material 160, such as silicon carbide (SiC) and/or silicon phosphide (SiP), is epitaxially grown by a LPCVD operation to form the source and drain regions 125 for an n-type Fin FET device. In at least another embodiment, the strained material 160, such as silicon germanium (SiGe), is epitaxially grown by a LPCVD operation to form the source and drain regions 125 for a p-type Fin FET device. In this example, the n-type Fin FET may be covered by, for example, a silicon nitride (SiN) layer such that the n-type Fin FET is protected during the recess and source/drain formation in the p-type Fin FET. After the strained material 160 is formed for the p-type Fin FET, the p-type Fin FET is covered by the SiN layer, and then similar operations including recess formation and strain material formation are performed on the n-type Fin FET.

Figure 13:
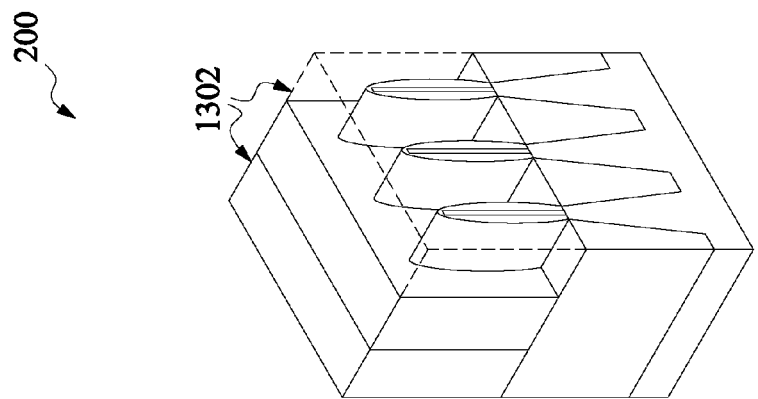

FIG. 13 is a perspective view of the Fin FET device 200 at one of various stages of a first sequential fabrication process according to an embodiment of the present disclosure. After forming the strain material 160, an operation of depositing an interlayer dielectric (ILD) layer 1302 is performed. The ILD layer 1302 is deposited by a suitable technique, such as CVD. In this example, the ILD layer 1302 may be applied as a layer uniformly over the source/drain regions 125. The ILD layer 1302 includes one or more layers of a dielectric material, such as silicon oxide, silicon nitride, a low-k dielectric material or a combination thereof. The ILD layer 1302 may be subsequently planarized by a CMP operation.

Figure 14:
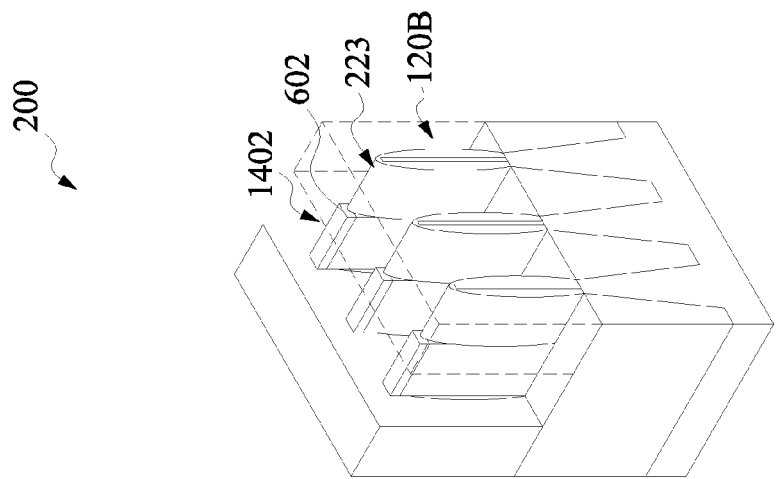

FIG. 14 is a perspective view of the Fin FET device 200 at one of various stages of a first sequential fabrication process according to an embodiment of the present disclosure. After CMP of the ILD layer 1302, an operation of removing the dummy gate (e.g., the gate stack 130) and an operation of removing the dummy gate dielectric (e.g., the gate dielectric layer 132) are performed, hence leaving an open area 1402. The dummy gate and dummy gate dielectric are removed using suitable etching operations. In this embodiment, the hard mask layer 602 interposed between the gate stack 130 and the semiconductor fins 120 remains on the top surface 223 of the channel region 120B.

Figure 15:
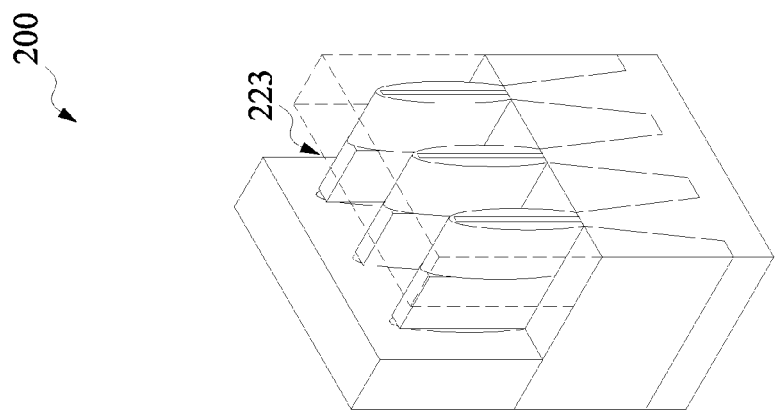

FIG. 15 is a perspective view of the Fin FET device 200 at one of various stages of a first sequential fabrication process according to an embodiment of the present disclosure. Following the removal of the gate stack 130, the hard mask layer 602 that remained on the top surface 223 of the channel region 120B is removed. The hard mask layer 602 can be removed by suitable etching operations. In this regard, the removal of the hard mask layer 602 provides for an increase in the gate control thereby yielding an increase in performance of the operational current. If the hard mask layer 602 remains on the channel region 120B, the gate control would be adversely affected thereby inducing operational current degradation by about 6-10%. In some aspects, the induced operational current degradation worsens as the thickness of the hard mask layer 602 increases. By removing the hard mask layer 602, such problems can be eliminated.

Figure 16:
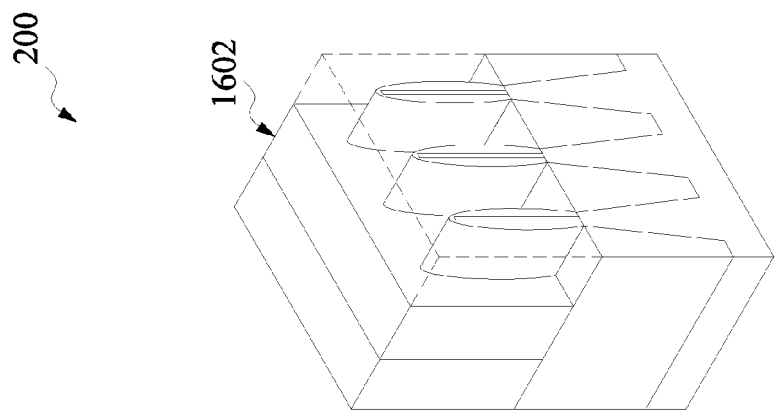

FIG. 16 is a perspective view of the Fin FET device 200 at one of various stages of a first sequential fabrication process according to an embodiment of the present disclosure. Subsequently, a metal gate 1602 and a high-k gate dielectric (not shown) are formed over the channel region 120B. According to embodiments of the disclosure, the high-k gate dielectric may include one or more layers of $HfO_2$, HfSiO, HfSiON, HMO, HfSiO, HfZrO, zirconium oxide, aluminum oxide, hafnium dioxide-alumina ($HfO_2$—$Al_2O_3$) alloy, other suitable high-k dielectric materials, or combinations thereof. The metal gate 1602 material may include one or more layers of Ti, TiN, titanium-aluminum alloy, Al, AlN, Ta, TaN, TaC, TaCN, TaSi, and the like.

Figure 17:
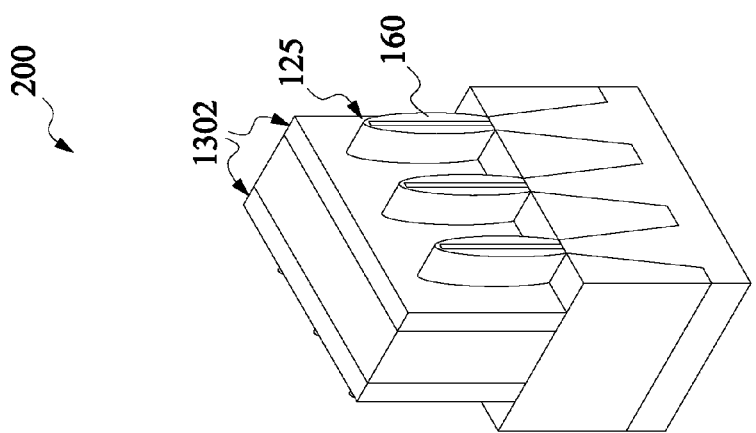

FIG. 17 is a perspective view of the Fin FET device 200 at one of various stages of a first sequential fabrication process according to an embodiment of the present disclosure. After formation of the metal gate electrode structure, the source/drain regions 125 are exposed by etching part of the ILD layer 1302. In some embodiments, openings over the source/drain regions 125 may be formed by patterning the ILD layer 1302, such as a lithographic process together with an etch operation to form the openings exposing the source/drain regions with strain material 160.

Figure 18:
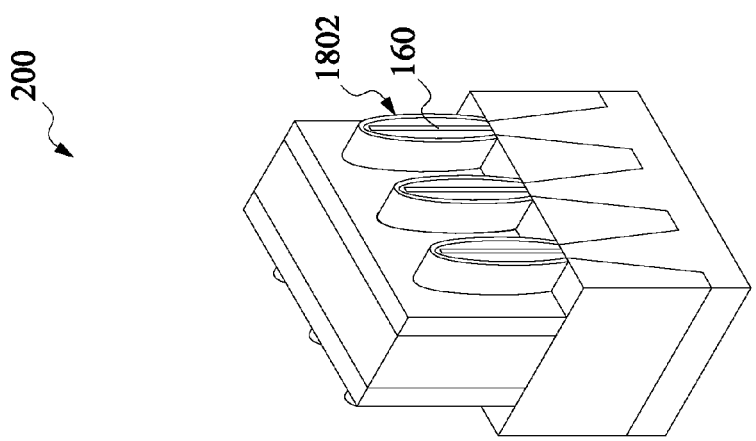

FIG. 18 is a perspective view of the Fin FET device 200 at one of various stages of a first sequential fabrication process according to an embodiment of the present disclosure. After exposing the source/drain regions 125 from the ILD layer 1302, an operation of depositing a conductive material to form a wrap-around contact layer 1802 (or an interlayer contact layer) on the surface of the strained material 160 is performed. The wrap-around contact layer 1802 may represent an interconnection to/from the source/drain regions 125.

The wrap-around contact layer 1802 is deposited by a suitable technique, such as sputtering, plating or CVD. In one embodiment, the wrap-around contact layer 1802 may be applied as a uniform layer over the source/drain regions 125. Examples of the conductive material include one or more layer of metal such as Al, Cu, W, Ti, Ta, TiN, TiAl, TiAlN, TaN, NiSi, CoSi, other conductive materials.

Figure 19:
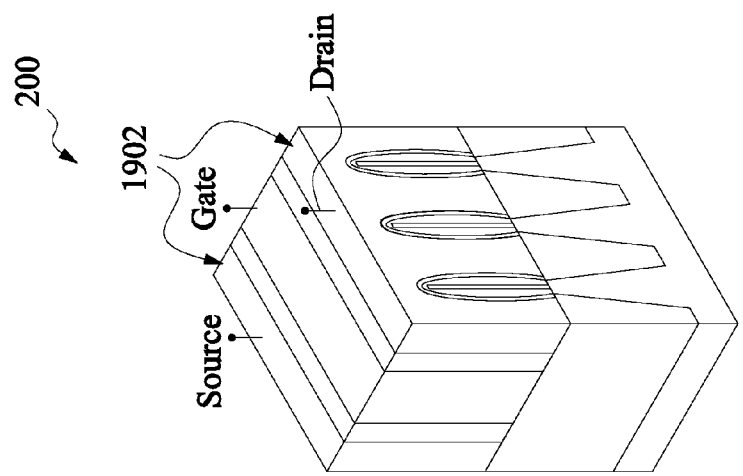

FIG. 19 is a perspective view of the Fin FET device 200 at one of various stages of a first sequential fabrication process according to an embodiment of the present disclosure. After forming the wrap-around contact layer 1802, an operation of depositing an interconnect layer 1902 may be performed. In some aspects, the interconnect layer 1902 serves as a contact plug to interconnect the wrap-around contact layer 1802 to upper wiring layers (not shown) of the Fin FET device 200.

In this example, the interconnect layer 1902 may be applied to fill in the opening/space over wrap-around contact layer 1802 formed over the source/drain regions 125. A suitable conductive material, such as copper, tungsten, nickel, titanium, or the like, is deposited on the wrap-around contact layer 1802. For example, tungsten may be used to form tungsten plugs in the opening over the source/drain regions 125. The interconnect layer 1902 may be formed by CVD, PVD, plating, etc. A damascene technology may be utilized to form the interconnect layer 1902.

In contrast to the Fin FET device 100 (FIG. 1A), the combination of a trimmed source/drain regions and conformal epitaxial strained material growth on the source/drain regions 125 of the Fin FET device 200 (FIG. 19) increases the contact area and reduces the parasitic capacitance present in the Fin FET device 200. For example, in merged diamond-shaped source/drain regions 125 (FIG. 1A), a contact plug may contact only the upper surface of the merged source/drain regions 125. In contrast, in FIG. 19, the contact plug (e.g., the interconnect layer 1902) can contact the side surfaces of the source/drain regions 125, and therefore greater contact area can be obtained, which reduces parasitic capacitance.

FIGS. 20-31 illustrate examples of perspective views of intermediate stages of a second sequential fabrication process of a Fin FET structure in accordance with some embodiments of the present disclosure. Because many of the operations and features in this embodiment are the same or similar to the operations with respect to FIGS. 2-19, some of the detailed discussion may be omitted for simplification.

Figure 20:
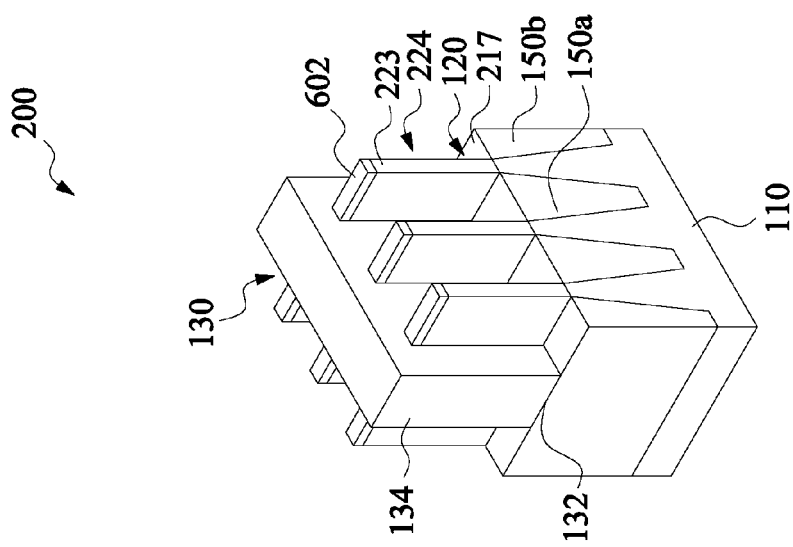

FIG. 20 is a perspective view of the Fin FET device 200 at one of various stages of a second sequential fabrication process according to an embodiment of the present disclosure. Similar to FIG. 8, gate stack 130 is formed over the substrate 110 over the top surface 223 and sidewalls 224 of the semiconductor fin 120, and extending to the top surfaces 217 of the first isolation region 150a and the second isolation region 150b. A section of the hard mask layer 602 is interposed between the semiconductor fin 120 and the gate stack 130. The gate stack 130 includes a gate dielectric layer 132 and a gate electrode layer 134 disposed on the gate dielectric layer 132.

Figure 21:
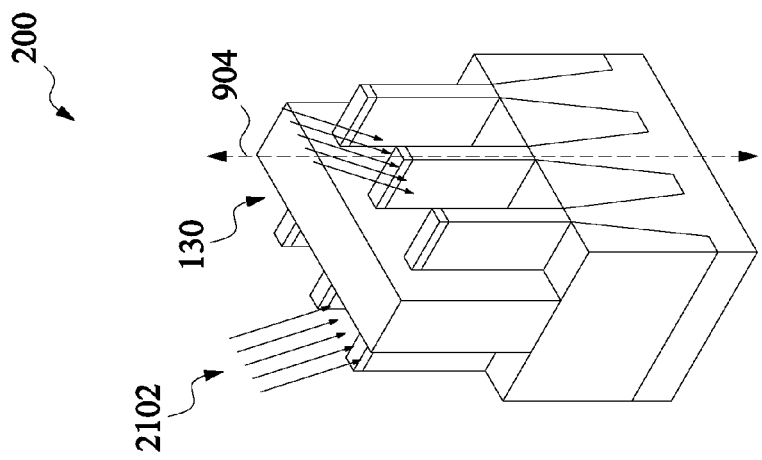

FIG. 21 is a perspective view of the Fin FET device 200 at one of various stages of a second sequential fabrication process according to an embodiment of the present disclosure. Similar to FIG. 9, following the formation of the gate stack 130, a LDD implantation 2102 is performed on the source/drain regions 125 of the semiconductor fins 120. The LDD implantation 2102 may be performed with a tilt angle relative to the vertical axis 904. In one or more implementations, the LDD implantation 2102 may not be performed if the hard mask layer 602 is removed from the top surface 223 of the semiconductor fins 120 immediately after the patterning of the gate stack 130.

Figure 22:
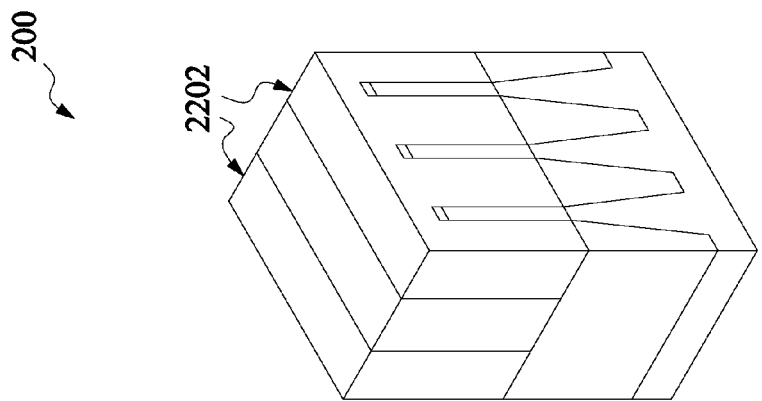
FIGS. 20-31 illustrate examples of perspective views of intermediate stages of a second sequential fabrication process of a Fin FET structure in accordance with another embodiment of the present disclosure.

FIG. 22 is a cross-sectional perspective view of the Fin FET device 200 at one of various stages of a second sequential fabrication process according to an embodiment of the present disclosure. Similar to FIG. 13 but unlike FIGS. 10-12, an operation of depositing an interlayer dielectric (ILD) layer 2202 is performed. The ILD layer 2202 is deposited by a suitable technique, such as CVD. In this example, the ILD layer 2202 may be applied as a layer uniformly over the source/drain regions 125. The ILD layer 2202 may be subsequently planarized by a CMP operation.

Figure 23:
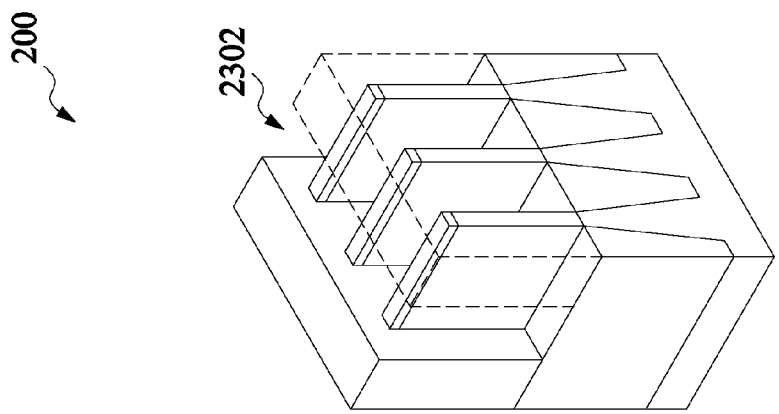

FIG. 23 is a perspective view of the Fin FET device 200 at one of various stages of a second sequential fabrication process according to an embodiment of the present disclosure. Similar to FIG. 14, after CMP of the ILD layer 2202, an operation of removing the gate stack 130 and an operation of removing the gate dielectric layer 132 are performed, hence leaving an open area 2302. The gate stack 130 and the gate dielectric layer 132 are removed using suitable etching operations.

Figure 24:
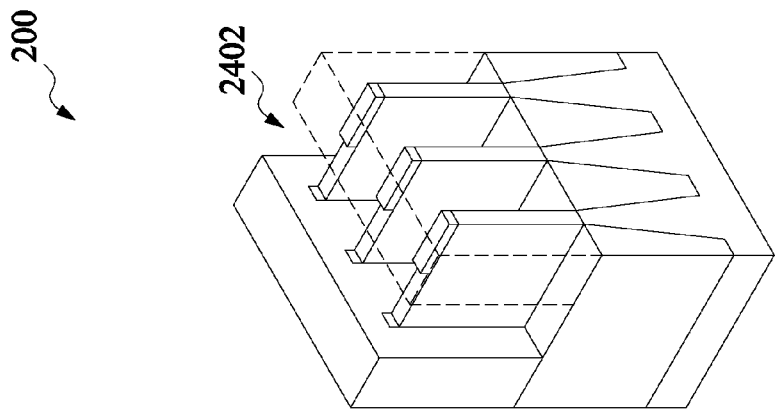

FIG. 24 is a perspective view of the Fin FET device 200 at one of various stages of a second sequential fabrication process according to an embodiment of the present disclosure. Similar to FIG. 15, following the removal of the gate stack 130, the hard mask layer 602 that remained on the top surface 223 of the channel region 120B is removed, resulting etched area 2402. The hard mask layer 602 can be removed by suitable etching operations.

Figure 25:
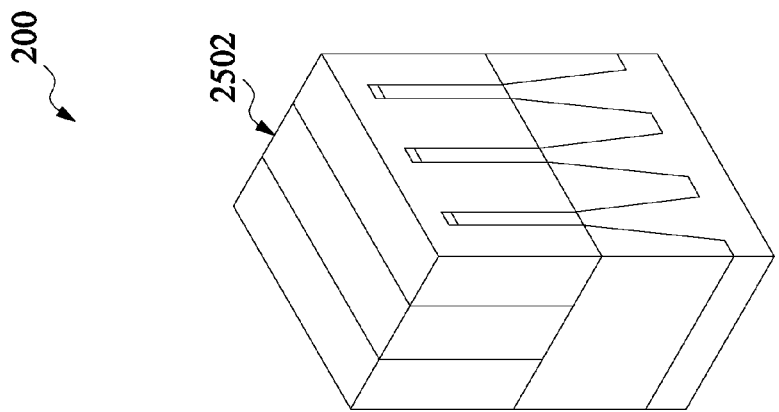

FIG. 25 is a perspective view of the Fin FET device 200 at one of various stages of a second sequential fabrication process according to an embodiment of the present disclosure. Similar to FIG. 16, after the hard mask layer 602 is removed, an operation of depositing a metal gate structure including a metal gate 2502 and a high-k gate dielectric layer (not shown) within the open area 2302 (see, FIG. 23) is performed.

Figure 26:
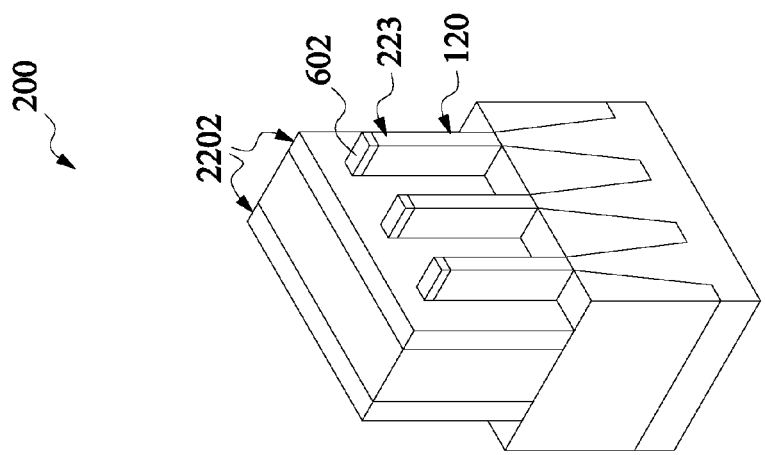

FIG. 26 is a perspective view of the Fin FET device 200 at one of various stages of a second sequential fabrication process according to an embodiment of the present disclosure. Similar to FIG. 17, by using an etching operation such as dry etching and/or wet etching on the ILD layer 2202, the source/drain regions 125 of the semiconductor fins 120 are exposed as shown in FIG. 26. The etching operation may be performed as one etching operation or multiple etching operations. In this embodiment, the hard mask layer 602 remains on the top surface 223 of the exposed semiconductor fins 120.

Figure 27:
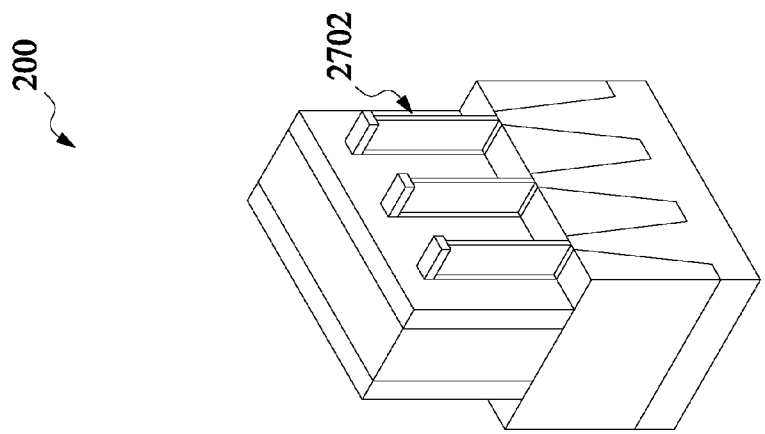

FIG. 27 is a perspective view of the Fin FET device 200 at one of various stages of a second sequential fabrication process according to an embodiment of the present disclosure. Similar to FIG. 10, after the source/drain regions 125 are exposed from the ILD layer 2202, a lateral trimming of the sidewalls 224 of the source/drain regions 125 of the semiconductor fins 120 by an etch operation 2702 is performed. In some embodiments, the etch operation 2702 is applied recursively in a closed loop until the desired post-trimming width is reached. For example, a number of iterations for removing material from the sidewalls 224 are performed until the width of the source/drain regions 125 becomes about 40% to about 60% of the original width of the channel region 120B. The hard mask layer 602 protects the top surface 223 of the source/drain regions 125 of the semiconductor fins 120.

Figure 28:
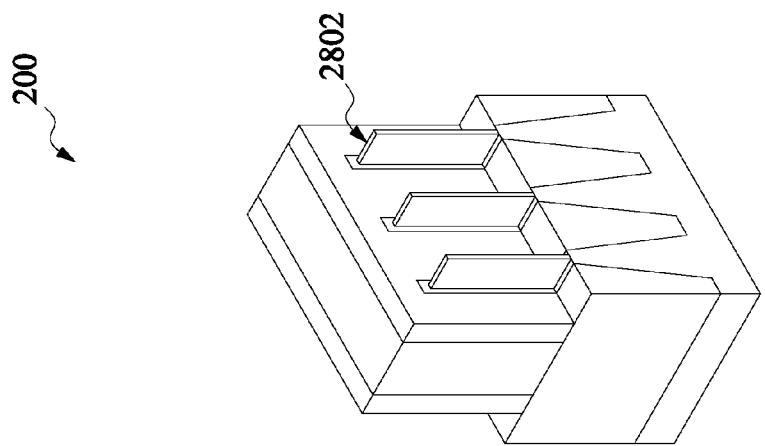

FIG. 28 is a perspective view of the Fin FET device 200 at one of various stages of a second sequential fabrication process according to an embodiment of the present disclosure. Similar to FIG. 11, after the trimming operation, the hard mask layer 602 is removed from the top surface 223 of the semiconductor fins 120. The hard mask layer 602 may be removed using suitable etching and/or cleaning operations.

Figure 29:
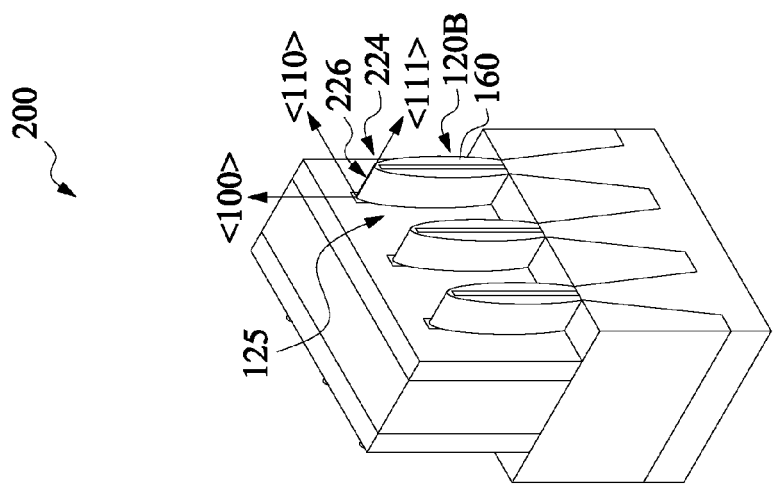

FIG. 29 is a perspective view of the Fin FET device 200 at one of various stages of a second sequential fabrication process according to an embodiment of the present disclosure. Similar to FIG. 12, a strained material 160 is selectively grown over the source/drain region 125 of the semiconductor fin 120 to cover the surface of the sidewalls 224 and top surface 223 of the source/drain regions 125 along the different crystal orientations (e.g., <100>, <110>, <101>). In this embodiment, the strained material 160 is formed spatially separated (without merging) with respect to each semiconductor fin 120. Like in FIG. 11, the trimmed portions of the source/drain regions 125 allow for the size of the source and drain regions 125 to be reduced along the <110> axis, thereby reducing the likelihood of the strain material 160 of merging.

Figure 30:
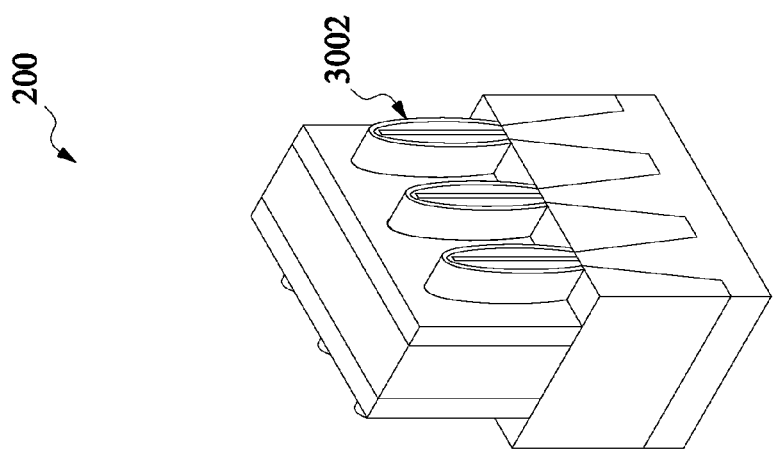

FIG. 30 is a perspective view of the Fin FET device 200 at one of various stages of a second sequential fabrication process according to an embodiment of the present disclosure. Similar to FIG. 18, after forming the strain material 160, an operation of depositing a conductive material to form a wrap-around contact layer 3002 (or an interlayer contact layer) on the surface of the strained material 160 is performed. The wrap-around contact layer 1802 is deposited by a suitable technique such as CVD or ALD.

Figure 31:
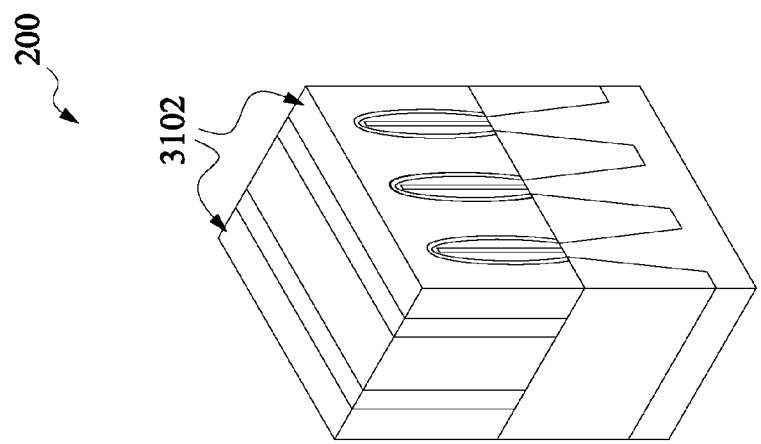

FIG. 31 is a perspective view of the Fin FET device 200 at one of various stages of a second sequential fabrication process according to an embodiment of the present disclosure. Similar to FIG. 19, after forming the wrap-around contact layer 3002, an operation of depositing an interconnect layer 3102 is performed. In some aspects, the interconnect layer 3102 serves as a contact plug to interconnect the wrap-around contact layer 3002 to other interconnect layers (not shown) of the Fin FET device 200.

Subsequent processing according to embodiments of the present disclosure may also form various contacts/vias/lines and multilayer interconnect features (e.g., metal layers and interlayer dielectrics) on the semiconductor substrate 110, configured to connect the various features or structures of the Fin FET device 200. For example, a multilayer interconnection includes vertical interconnects, such as conventional vias or contacts, and horizontal interconnects, such as metal lines.

The Fin FET device 200 serves only as one example. The Fin FET device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The present disclosure provides for the formation of non-faceted fin-shaped, high aspect ratio (e.g., tall and thin) epitaxial source/drain regions that do not merge with that of an adjacent fin device. The combination of the wrap-around contact and the conformal epitaxial source/drain on fin-shaped source/drain can increase the amount of contact area and reduce the parasitic resistance in the Fin FET device. In addition, source/drain defects may be avoided due to the absence of merged source/drain regions. The advantageous features of the present disclosure include compatibility with existing FinFET-based CMOS device fabrication process flows with low additional cost compared with the original fabrication flow.

According to one embodiment of the present disclosure, in a method of fabricating a fin field-effect transistor (Fin FET) device, a first fin structure and a second fin structure are provided over a substrate. The first and second fin structures protrude from an isolation insulating layer disposed over the substrate. A gate structure is formed over the first fin structure and the second fin structure. Each of the first fin structure and the second fin structure has a channel region beneath the gate structure and source/drain regions outside of the gate structure. The source/drain regions have a first width. Portions of sidewalls of the source/drain regions in the first fin structure and the second fin structure are removed to form trimmed source/drain regions. Each of the trimmed source/drain regions has a second width smaller than the first width. A strain material is formed over the trimmed source/drain regions of the first fin structure and the second fin structure. The strain material is formed such that the strain material formed on the first fin structure is separated from the strain material formed on the second fin structure. An interlayer dielectric layer is formed over the gate structure and the source/drain regions with the strain material. A contact layer is formed on the strain material formed on the source/drain regions of the first fin structure and the second fin structure such that the contact layer wraps around the strain material on the source/drain regions.

In another embodiment, in a method of fabricating a Fin FET device, a first fin structure and a second fin structure are provided over a substrate. The first and second fin structures protrude from an isolation insulating layer disposed over the substrate. A gate structure is formed over the first fin structure and the second fin structure. Each of the first fin structure and the second fin structure has a channel region beneath the gate structure and source/drain regions outside of the gate structure. The source/drain regions have a first width. An interlayer dielectric layer is formed over the gate structure and the source/drain regions having the first width. Parts of the interlayer dielectric layer are removed to expose the source/drain regions having the first width. Portions of sidewalls of the exposed source/drain regions of the first fin structure and the second fin structure are removed to form trimmed source/drain regions. Each of the trimmed source/ drain regions has a second width smaller than the first width. A strain material is formed over the trimmed source/drain regions of the first fin structure and the second fin structure. The strain material is formed such that the strain material formed on the first fin structure is separated from the strain material formed on the second fin structure. A contact layer is formed on the strain material formed on the first fin structure and the second fin structure such that the contact layer wraps around the strain material of the source/drain regions.

In still another embodiment, a semiconductor device comprises a substrate, first and second fin structure, a gate structure, first and second strain material layer and a contact layer. The first fin structure is disposed over the substrate and includes a first channel region and a first source/drain region. The second fin structure is disposed over the substrate and includes a second channel region and a second source/drain region. The gate structure is disposed over at least a portion of the first fin structure and the second fin structure. The first and second channel regions are beneath the gate structure and the first and second source/drain regions are outside of the gate structure. The first strained material layer is disposed over the first source/drain region and the second strain material layer is disposed over the second source/drain region. The first and second strain material layers provide stress to the first and second channel regions, respectively. The contact layer wraps around the first and second strain material layers. The first strain material layer is separated from the second strain material layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field-effect transistor (Fin FET) device, the method comprising:
   providing a first fin structure and a second fin structure over a substrate, the first and second fin structures protruding from an isolation insulating layer disposed over the substrate;
   forming a gate structure over the first fin structure and the second fin structure, each of the first fin structure and the second fin structure having a channel region beneath the gate structure and source/drain regions outside of the gate structure, the source/drain regions having a first width;
   removing portions of sidewalls of the source/drain regions in the first fin structure and the second fin structure to form trimmed source/drain regions, each of the trimmed source/drain regions having a second width smaller than the first width;
   forming a strain material over the trimmed source/drain regions of the first fin structure and the second fin structure, the strain material being formed such that the strain material formed on the first fin structure is separated from the strain material formed on the second fin structure;
   forming an interlayer dielectric layer over the gate structure and the source/drain regions with the strain material; and
   forming a contact layer on the strain material formed on the source/drain regions of the first fin structure and the second fin structure such that the contact layer wraps around the strain material on the source/drain regions.

2. The method of claim 1, wherein the providing a first fin structure and a second fin structure comprises:
   forming fins over the substrate;
   forming an insulating material layer such that the fins are embedded in the insulating material layer;
   recessing portions of the embedded fins to form respective recessed openings in the insulating material layer;
   depositing a semiconductor material into the respective recessed openings over the recessed embedded fins; and
   removing part of the insulating material layer to expose upper portions of the deposited semiconductor material, the first fin structure and the second fin structure including the exposed upper portions, respectively, and a remaining portion of the insulating material layer being the isolation insulating layer.

3. The method of claim 2, wherein a mask layer is further formed over the semiconductor material deposited into the respective recessed openings.

4. The method of claim 3, wherein the removing portions of sidewalls of the source/drain regions is performed with the mask layer as an etching mask.

5. The method of claim 4, further comprising removing the mask layer by an etching operation after the trimmed source/drain regions are formed.

6. The method of claim 1, further comprising:
   applying an ion implantation on sidewalls of the channel region in the first fin structure and the second fin structure, wherein the ion implantation is applied with a tilt angle greater than zero.

7. The method of claim 1, wherein the second width is 40% to 60% of the first width.

8. The method of claim 1, wherein:
   the gate structure is a dummy gate structure, and
   the method further comprises, after forming an interlayer dielectric layer and before the forming a contact layer:
      removing the dummy gate structure to form an opening; and
      forming a metal gate structure including a gate dielectric layer and a metal gate electrode in the opening.

9. The method of claim 1, wherein the forming a contact layer comprises:
   forming a conductive layer over the strain material; and
   forming a conductive material to wrap the conductive layer and fill a space between the first and second source/drain regions.

10. A method of fabricating a fin field-effect transistor (Fin FET) device, the method comprising:
    providing a first fin structure and a second fin structure over a substrate, the first and second fin structures protruding from an isolation insulating layer disposed over the substrate;
    forming a gate structure over the first fin structure and the second fin structure, each of the first fin structure and the second fin structure having a channel region beneath the gate structure and source/drain regions outside of the gate structure, the source/drain regions having a first width;
    forming an interlayer dielectric layer over the gate structure and the source/drain regions having the first width;
    removing parts of the interlayer dielectric layer to expose the source/drain regions having the first width;
    removing portions of sidewalls of the exposed source/drain regions of the first fin structure and the second fin structure to form trimmed source/drain regions, each of the trimmed source/drain regions having a second width smaller than the first width;
    forming a strain material over the trimmed source/drain regions of the first fin structure and the second fin structure, the strain material being formed such that the strain material formed on the first fin structure is separated from the strain material formed on the second fin structure; and
    forming a contact layer on the strain material formed on the first fin structure and the second fin structure such that the contact layer wraps around the strain material of the source/drain regions.

11. The method of claim 10, wherein the providing a first fin structure and a second fin structure comprises:
    forming fins over the substrate;
    forming an insulating material layer such that the fins are embedded in the insulating material layer;
    recessing portions of the embedded fins to form respective recessed openings in the insulating material layer;
    depositing a semiconductor material into the respective recessed openings over the recessed embedded fins; and
    removing part of the insulating material layer to expose upper portions of the deposited semiconductor material, the first fin structure and the second fin structure including the exposed upper portions, respectively, and a remaining portion of the insulating material layer being the isolation insulating layer.

12. The method of claim 11, wherein a mask layer is further formed over the semiconductor material deposited into the respective recessed openings.

13. The method of claim 12, wherein:
    the method further comprises, after forming an interlayer dielectric layer and before the removing parts of the interlayer dielectric layer:
       removing the dummy gate structure to form an opening;
       removing part of the mask layer exposed in the opening; and
       forming a metal gate structure including a gate dielectric layer and a metal gate electrode in the opening.

14. The method of claim 12, wherein the removing portions of sidewalls of the source/drain regions is performed with the mask layer as an etching mask.

15. The method of claim 14, further comprising removing the mask layer by an etching operation after the trimmed source/drain regions are formed.

16. The method of claim 10, wherein the forming a contact layer comprises:
    forming a conductive layer over the strain material; and
    forming a conductive material to wrap the conductive layer and fill a space between the first and second source/drain regions.

17. A method of fabricating a fin field-effect transistor (Fin FET) device, the method comprising:
    providing a fin structure over a substrate, the fin structure protruding from an isolation insulating layer disposed over the substrate;
    forming a gate structure over the fin structure, the fin structure having a channel region beneath the gate structure and source/drain regions outside of the gate structure, the source/drain regions having a first width;
    removing portions of sidewalls of the source/drain regions in the fin structure to form trimmed source/drain regions, each of the trimmed source/drain regions having a second width smaller than the first width;
    forming a strain material over the trimmed source/drain regions of the fin structure, the strain material being formed such that the strain material covers an entirety of sidewalls of the trimmed source/drain regions;

forming an interlayer dielectric layer over the gate structure and the source/drain regions with the strain material; and forming a contact layer on the strain material formed on the source/drain regions of the fin structure such that the contact layer wraps around the strain material on the source/drain regions.

18. The method of claim 17, wherein the providing the fin structure comprises:

forming a fin over the substrate;

forming an insulating material layer such that the fin is embedded in the insulating material layer;

recessing portions of the embedded fin to form a recessed opening in the insulating material layer;

depositing a semiconductor material into the recessed opening over the recessed embedded fin; and removing part of the insulating material layer to expose an upper portion of the deposited semiconductor material, the fin structure including the exposed upper portion and a remaining portion of the insulating material layer being the isolation insulating layer.

19. The method of claim 18, wherein:

a mask layer is further formed over the semiconductor material deposited into the respective recessed opening, and the removing portions of sidewalls of the source/drain regions is performed with the mask layer as an etching mask.

20. The method of claim 17, wherein the second width is 40% to 60% of the first width.

\* \* \* \* \*